United States Patent [19]
Kopera

[11] Patent Number: 5,808,469
[45] Date of Patent: Sep. 15, 1998

[54] BATTERY MONITOR FOR ELECTRIC VEHICLES

[75] Inventor: John J. C. Kopera, Rochester Hills, Mich.

[73] Assignee: Chrysler Corporation, Auburn Hills, Mich.

[21] Appl. No.: 820,749

[22] Filed: Mar. 19, 1997

Related U.S. Application Data

[62] Division of Ser. No. 369,250, Jan. 6, 1995, Pat. No. 5,646,534.

[51] Int. Cl.$^6$ .......................... G01R 31/36; G01N 27/416
[52] U.S. Cl. ............................................. 324/434; 324/428
[58] Field of Search .................................... 324/426, 427, 324/428, 431, 434; 320/48; 340/636

[56] References Cited

U.S. PATENT DOCUMENTS

| | | | |
|---|---|---|---|
| 3,307,101 | 2/1967 | Byles | 324/429 |
| 4,360,766 | 11/1982 | Bogardus, Jr. | 318/139 |
| 4,401,942 | 8/1983 | Renz | 324/427 |
| 4,484,140 | 11/1984 | Dieu | 324/434 |
| 4,590,430 | 5/1986 | Vandenberghe et al. | 324/427 |
| 4,633,418 | 12/1986 | Bishop | 364/554 |
| 4,931,738 | 6/1990 | MacIntyre et al. | 324/435 |
| 5,111,132 | 5/1992 | Motose | 322/90 |
| 5,170,124 | 12/1992 | Blair et al. | 324/434 |
| 5,250,904 | 10/1993 | Salander et al. | 324/430 |
| 5,270,946 | 12/1993 | Shibasaki et al. | 364/492 |
| 5,321,627 | 6/1994 | Reher | 364/483 |
| 5,345,392 | 9/1994 | Mito et al. | 364/483 |
| 5,444,378 | 8/1995 | Rogers | 324/428 |
| 5,546,003 | 8/1996 | Noworolski et al. | 324/434 |
| 5,602,481 | 2/1997 | Fukuyama | 324/434 |
| 5,619,417 | 4/1997 | Kendall | 364/483 |
| 5,705,929 | 1/1998 | Caravello et al. | 324/434 |
| 5,712,568 | 1/1998 | Flohr et al. | 324/434 |

*Primary Examiner*—Glenn W. Brown
*Attorney, Agent, or Firm*—Mark P. Calcaterra

[57] ABSTRACT

A battery monitor for monitoring the voltage and temperature of the batteries associated with a battery pack of an electric vehicle. The battery monitor includes an opto-isolator that electrically separates an isolated portion of the battery monitor connected to the batteries from a non-isolated portion of the battery monitor that transmits battery voltage and temperature signals to a vehicle controller of the electric vehicle. The battery monitor is positioned proximate to a battery tub holding the batteries of the electric vehicle so that high voltage wires connected to the batteries within the battery tub are limited in length for safety purposes. Further, a limited number of wires transmitting the battery voltage and battery temperature signals from the battery monitor to the vehicle controller are required. The battery monitor can include a multiplexer that selectively transmits the battery voltage and temperatures signals to the opto-isolator in a controlled manner, or can include a series of other opto-isolators that transmit high power battery signals to a capacitor to be charged where the charge on the capacitor is representative of the voltage of a particular battery.

20 Claims, 2 Drawing Sheets

BATTERY MONITOR FOR ELECTRIC VEHICLES

This is a division of U.S. patent application Ser. No. 08/369,250, filed Jan. 6,1995, now U.S. Pat. No. 5,646,534.

BACKGROUND OF THE INVENTION

1. Field of the Invention

This invention relates generally to a battery monitor for monitoring the batteries of an electric vehicle and, more particularly, to a battery monitor that monitors the voltage and temperature of the batteries of an electric vehicle where the battery monitor is positioned proximate to the batteries.

2. Discussion of the Related Art

Today there is a growing demand for electric vehicles which run on electric power stored in multiple banks of batteries. Increased use of electric vehicles has been fueled by many factors including consumer demand, emission concerns with internal combustion engines and increased governmental regulations.. Because of a number of obvious and industry related reasons, it is necessary to monitor the voltage and temperature of the batteries used by the electric vehicles.

As is well understood, it is desirable to control the charging of the batteries of an electric vehicle. To achieve the optimum and most rapid charging rate, the voltage and temperature of the batteries must be monitored to insure that the batteries do not overheat during the charging procedure. Further, it is necessary to monitor battery capacity during operation of the vehicle to determine existing battery capabilities. Conventional methods for monitoring battery voltage and temperature have several disadvantages. For example, typical battery monitoring devices for monitoring battery voltage use isolation amplifiers to isolate the battery voltage and associated current from the monitoring device. These isolation amplifiers generally use transformers, which are heavy and costly, to achieve the required isolation. Also, known monitoring devices require multiple wires attached to each battery that are routed throughout the vehicle possibly providing electromagnetic compatibility (EMC) problems with the various electrical modules used in the vehicle. In addition, some monitoring devices utilize common grounding schemes which connect the vehicle's supply voltage for its electric modules to the battery's high voltage system. Therefore, the batteries and the associated high currents are not galvanically isolated from the electric modules in the vehicle.

What is needed is a battery monitor for electric vehicles which does not suffer from the above-mentioned disadvantages. This will eliminate the use of costly transformers, reduce electromagnetic compatibility (EMC) concerns, reduce overall vehicle wiring and isolate the battery voltage and currents from the vehicles other electrical systems. It is, therefore, an object of the present invention to provide such a battery monitor for electric vehicles and a method therefore.

SUMMARY OF THE INVENTION

In accordance with the teachings of the present invention, a battery monitor is disclosed for monitoring the voltage and temperature of the batteries associated with the battery pack of an electric vehicle. The battery monitor includes an isolator that electrically separates an isolated portion of the battery monitor connected to the batteries from a non-isolated portion of the battery monitor that transmits battery voltage and temperature signals to a vehicle controller of the electric vehicle. The battery monitor is positioned proximate to a battery tub holding the batteries of the electric vehicle so that high voltage wires connected to the batteries within the battery tub are limited in length for safety purposes, and a limited number of wires transmitting the battery voltage and battery temperature signals from the battery monitor to the vehicle controller are required. In one embodiment, an attenuator and multiplexer selectively transmit the battery voltage and temperature signals to a single opto-isolator in a controlled manner to be transferred to the vehicle controller. In an alternate embodiment, a series of opto-isolators transmit a high voltage battery signal to a capacitor to be charged, and a single opto-isolator transfers the charge from the capacitor to the vehicle controller on the non-isolated side of the battery monitor.

BRIEF DESCRIPTION OF THE DRAWINGS

Still other advantages of the present invention will become apparent to those skilled in the art after reading the following specification and by reference to the following drawing in which.

DETAILED DESCRIPTION OF THE PREFERRED EMBODIMENT

The following description of a battery monitor for monitoring the battery temperature and voltage of a battery pack in an electric vehicle is merely exemplary in nature and in no way is intended to limit the invention or its application or uses. While this invention is described in connection with electric vehicles, those skilled in the art would readily recognize that the battery monitor can be incorporated to monitor batteries used with other systems.

Figure 1:
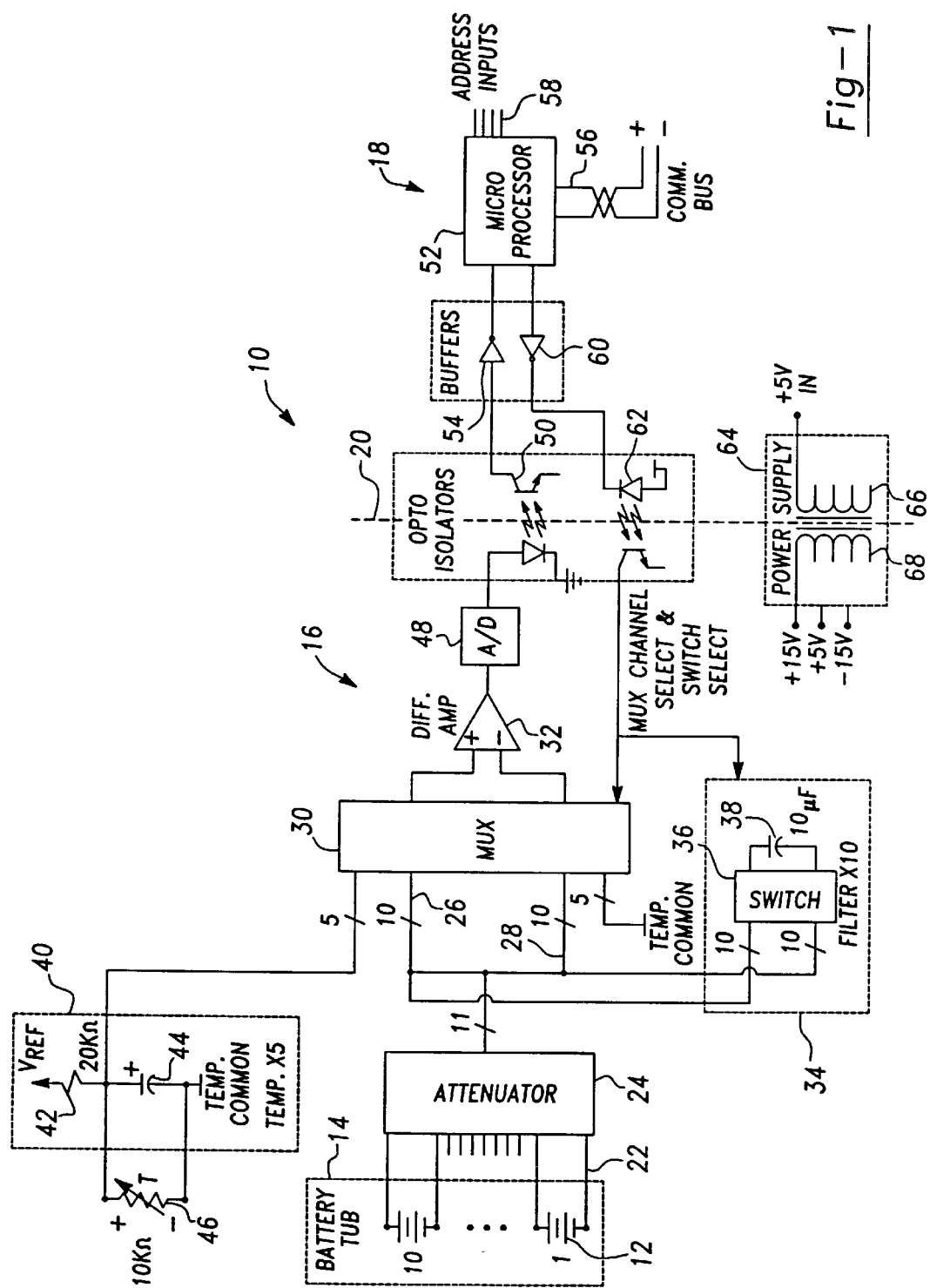
FIG. 1 is a schematic block diagram of a battery monitor according to one embodiment of the present invention.

Referring to FIG. 1, a schematic block diagram of a battery monitor 10 according to one embodiment of the present invention is shown. The battery monitor 10 is intended to monitor the battery temperature and voltage of a series of batteries 12 positioned within a battery tub 14. In one example, the battery tub 14 is one of three battery tubs each holding ten batteries 12 as is currently being used in the TEV minivan available from Chrysler Corporation. In this example, there would be three battery monitors each monitoring the batteries in one of the battery tubs.

The battery monitor 10 is separated into an isolated side 16 and a nonisolated side 18 at an isolation border 20. The isolated side 16 is electrically isolated from the non-isolated side 18 to eliminate all of the common voltage sources and grounds between the sides 16 and 18 (i.e., galvanically isolated). In this manner, the battery monitor 10 can be positioned proximate to the battery tub 14 or be mounted to the battery tub 14 so as to reduce high power regions of the electric vehicle for safety and electromagnetic compatibility (EMC) purposes.

The battery monitor 10 monitors battery temperature and voltage for the batteries 12 held in the battery tub 14. The batteries 12 are connected in series and each individual battery 12 has a voltage range of between about 0 to 20 volts. A series of high power input lines 22 are connected to the batteries 12 to provide a signal of the voltage across each battery 12. In this embodiment, a pair of high power input lines 22 is connected across each battery 12 such that a single line 22 is electrically connected between each battery 12. In this manner, a line 22 is connected to a positive terminal of one battery 12 and a negative terminal of an adjacent battery 12. Therefore, one line 22 is provided to determine a positive signal of one battery 12 and a negative signal of an adjacent battery 12. In this configuration, eleven input lines 22 are necessary to determine the voltage across each of the ten batteries 12. In a preferred embodiment, the battery monitor 10 is mounted on or in close proximity to the battery tub 14 to reduce the length of the high power input lines 22 which are connected to the batteries 12.

The voltages from the batteries 12 on the input lines 22 are applied to an attenuator 24. In one embodiment, the attenuator 24 has an 8:1 ratio so as to attenuate the voltages to a voltage range of between about 0 to 2.5 volts. The attenuator 24 includes a precision resistor divider network, well known to those skilled in the art, fabricated on a single substrate (not shown). This construction allows the attenuator 24 to be accurate since all the resistors in the network will vary evenly with any temperature changes.

The eleven output lines from the attenuator 24 include ten (10) positive (+) battery terminal lines 26 and ten (10) negative (−) battery terminal lines 28 for all of the batteries 12, as discussed above. The lines 26 and 28 are applied to a fifteen channel differential mode analog multiplexer 30. Ten of the channels of the analog multiplexer 30 are for the battery voltage outputs from the attenuator 24. Therefore, for each battery 12 there is a positive and negative voltage line from the attenuator 24. In one embodiment, the multiplexer 30 includes multiple ADG509AKN analog multiplexer chips each having four (4) input channels. A control signal (discussed below) applied to the multiplexer 30 causes the multiplexer 30 to select a pair of inputs from the lines 26 and 28 representing a voltage across one of the batteries 12. The selected voltage is applied to a differential amplifier 32 to be buffered and amplified.

The output lines from the attenuator 24 are also applied to a series of ten (10) switched filters 34, one of which is shown here. Each switched filter 34 receives a pair of voltage output lines from the attenuator 24 that represents the voltage across one of the batteries 12. Each switched filter 34 consists of a switch 36 and a capacitor 38. The switch 36 can be an ADG201AKN switch and the capacitor 38 can be a 10 $\mu f$ capacitor. A control signal (discussed below) causes the switched filters 34 to be selectively switched into the battery monitor 10 by the switches 36 simultaneously to filter out battery line noise and also to allow the capacitors 38 to pre-charge. During normal operation of the electric vehicle, the filters 34 are generally switched into the battery monitor 10 which causes a slower response time as a result of the capacitors 38 being charged. To obtain an instantaneous voltage measurement across the batteries 12, the filters 34 are switched out of the monitor 10.

The filters 34 are generally switched out of the monitor 10 momentarily when the electric vehicle is; not operating and the batteries 12 are in a charging routine since there is less battery line noise during this condition (i.e. no current flowing from batteries 12 to power electric motor). During the charging routine of the electric vehicle, the batteries 12 are momentarily removed from a charging circuit (not shown) which drops the current to zero. The filters 34 are then removed or switched out of the battery monitor 10 and an instantaneous battery voltage measurement is made. Thereafter, the charging circuit is again connected to the batteries 12 and the filters 34 are switched into the battery monitor 10. It should also be noted that the filters 34 can be switched out of the monitor 10 during normal operation of the electric vehicle to obtain an instantaneous voltage reading.

In addition to monitoring battery voltages, the battery monitor 10 monitors battery temperature using five (5) temperature monitors 40 one of which is shown here. The temperature monitors 40 monitor battery temperatures for every other battery 12 in the battery tub 14 since temperatures for adjacent batteries 12 are generally similar. The temperature monitors 40 consist of a voltage reference (Vref) and a resistor 42 in series with a filter capacitor 44. A temperature common signal from a known temperature source (not shown) is applied to the anode of the capacitor 44. A thermistor 46 connected in parallel with the filter capacitor 44 is mounted proximate to the battery 12 being monitored. The voltage reference is about 2.5 volts and can be provided by a stable voltage reference IC such as an AD580JT. The filter capacitor 44 is preferably a bank of capacitors such a 10 $\mu F$ tantalum capacitor in parallel with a 0.1 $\mu F$ ceramic capacitor to achieve a wide filter bandwidth. The thermistor 46 is preferably a Unicurve thermistor. The voltage drop across the five (5) thermistors 46 are applied to the multiplexer 30 along with the five (5) temperature common signals. The control signal applied to the multiplexer 30 also selects the temperature signals from the temperature monitors 40.

When the battery monitor 10 is measuring the battery voltage, the differential amplifier 32 determines the voltage difference between a pair of voltage channels that are selected by the multiplexer 30. A serial analog signal from the amplifier 32 is applied to an analog-to-digital (A/D) converter 48 which converts the analog signal to a digital serial signal. The A/D converter 48 could be any number of conventional analog to digital converters known in the art. The serial digital data is then transferred from the isolated side 16 across the border 20 by an opto-isolator 50. The opto-isolator 50 is a combination of a photodiode and a phototransistor where an optical signal from the photodiode representing the high power digital signal is transmitted across the border 20 to be received by the phototransistor on the low voltage non-isolated side 18 of the border 20. In one embodiment, the opto-isolator 50 is a high speed Hewlet Packard (HP) 6N137 opto-isolators. However, one skilled in the art would readily recognize that other opto-isolators could be used, as well as various other type of isolators such as transformers.

The digital serial data provided to the non-isolated side 18 through the opto-isolator 50 is applied to a microprocessor 52 through an inverter buffer 54. The microprocessor 52 can be a Motorola 68HC05X4 processor having an "on board" MCAN (Motorola Controller Area Network) differential communication bus 56. The communication bus 56 is a twisted pair communication bus which communicates with other modules throughout the electric vehicle. It should be noted that various other communication busses could also be utilized such as CCD, J1850 or ETHERNET. The battery monitor 10 is controlled by address inputs 58 to the microprocessor 52. The inputs 58 are externally jumpered in the vehicle wire harness such that multiple battery monitors 10 each monitoring a battery tub 14 in the electric vehicle can be independently communicated with.

In order to maintain the isolated side 16 electrically isolated, the microprocessor 52 sends commands to the isolated side 16 through an inverted buffer 60 and an opto-isolator 62. These commands control the switching of the filters 34 into and out of the battery monitor circuit 1 0, as well as the selection of the specific channels of the multiplexer 30. A signal on the address inputs 58 causes; the microprocessor 52 to send a control signal to the buffer 60. The buffer 60, in turn, sends a signal to the opto-isolator 62 to transfer the control signal from the microprocessor 52 across the border 20 in the same manner that the opto-isolator 50 transfers the transmitted battery signal across the border 20. The signal received by the phototransistor on the isolated side 16 is then applied to the multiplexer 30 and the switched filters 34, as shown. Therefore, by providing the proper signal on the address input 58, a particular battery 12 can be monitored for voltage and temperature as selected by the multiplexer 30.

In addition, a flyback style power supply 64 is also used to maintain proper isolation. The power supply 64 has primary windings 66 which are completely isolated from the secondary windings 68 since there is no feedback across the windings 66 and 68. Because of this, the voltage input (i.e. 5 volts) is supplied by a voltage regulator such as a TL750M05 which also powers the microprocessor 52.

In operation, a module on the electric vehicle requests battery voltage and/or battery temperature from the batteries 12 in a specific battery tub 14, via the communication bus 56 and the address inputs 58. The microprocessor 52 selects the channels of the multiplexer 30 and whether or not to switch the filters 34 out of the battery monitor 10. The battery voltage for a specific battery 12 or the temperature for a specific battery 12 represented by the voltage drop across the thermistor 46 is applied to the differential amplifier 32 and through the A/D converter 48. The serial digital signal is transferred across the isolated border 20 by the opto-isolator 50. This signal is received by the microprocessor 52 through the buffer 54. If a battery voltage was requested, the microprocessor will transfer this data via the communication bus 56. If a battery temperature was requested, the microprocessor 52 will do a linearization of the thermistor 46 temperature curve to determine the battery temperature based on the voltage drop across the thermistor 46. This temperature would also then be transmitted via the communication bus 56.

Figure 2:
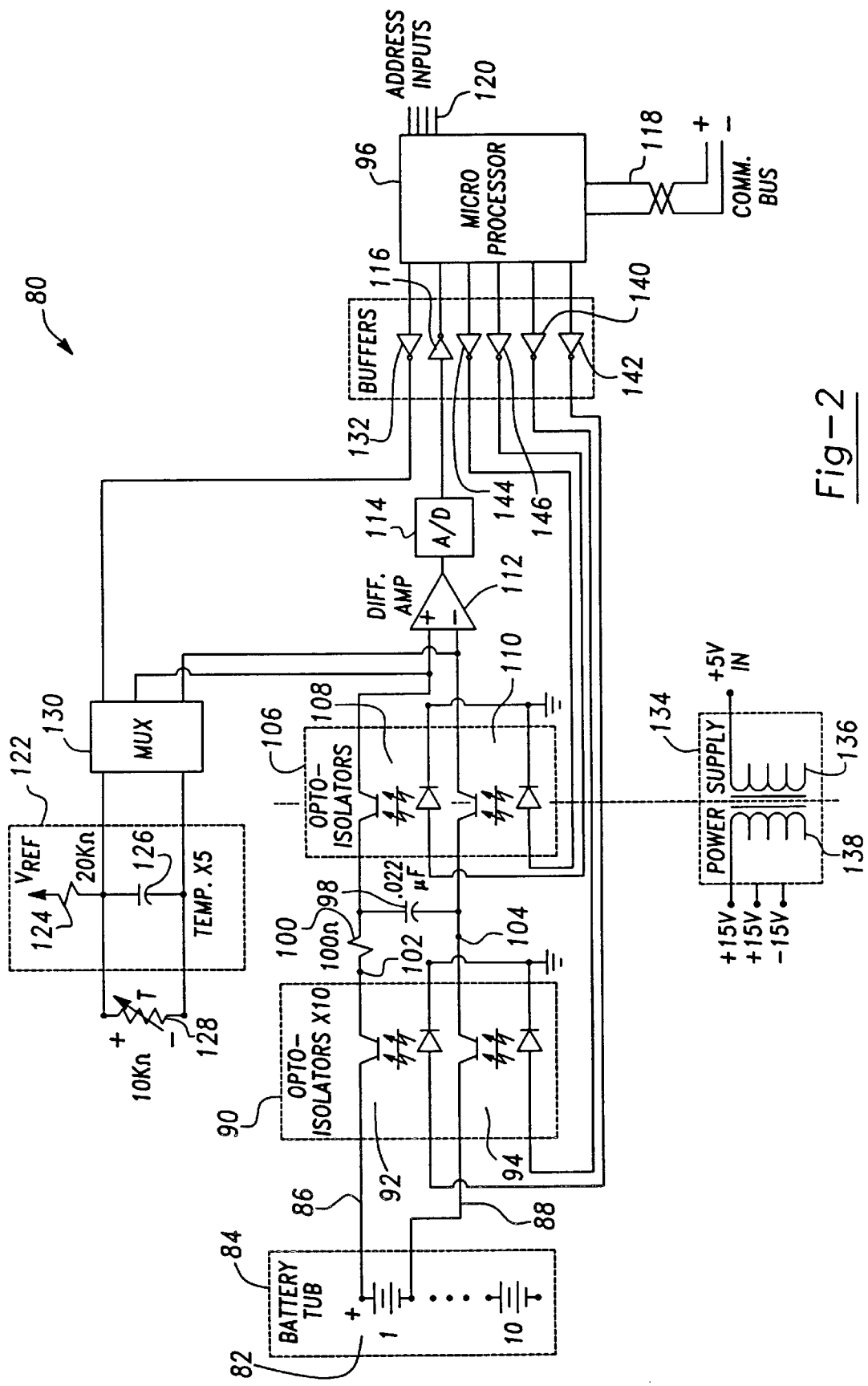
FIG. 2 is a schematic block diagram of a battery monitor according to another embodiment of the present invention.

Referring to FIG. 2, a battery monitor 80 according to another embodiment of the present invention is shown. The battery monitor 80 monitors the temperature and battery voltage for a series of batteries 82 held in a battery tub 84. The battery tub 84 includes ten batteries 82 connected in series similar to the batteries 12 in the battery tub 14 above in FIG. 1. A high voltage input line 86 is connected to each positive battery terminal and a high voltage input line 88 is connected to each negative battery terminal. For discussion purposes, only a single pair of high voltage input lines 86 and 88 are shown in FIG. 2, however, one skilled in the art would recognize that there would be ten (10) pairs of high voltage input lines 86 and 88 associated with the ten (10) batteries 82. Each pair of high voltage input lines 86 and 88 are applied to a separate bank of opto-isolators 90. The bank of opto-isolators 90 includes a first analog opto-isolator 92 connected to the positive high voltage input line 86 and a second analog opto-isolator 94 connected to the negative high voltage input line 88. The photodiodes in the opto-isolators 92 and 94 are activated by a microprocessor 96, as will be discussed in more detail below. When the photodiodes in the opto-isolators 92 and 94 are activated, the phototransistors in the opto-isolators 92 and 94 are turned on or conduct, which allows a capacitor 98 to be charged through an attenuator resistor 100. The resistor 100 is a 100 ohm resistor and the capacitor 98 is a 0.022 μf tantalum capacitor. Since there are ten batteries 82 in the battery tub 84, one skilled in the art would recognize that there will be 10 pairs of opto-isolators 92 and 94 connected in the parallel across connection points 102 and 104.

Once the capacitor 98 has been fully charged, the microprocessor 96 turns off or opens the opto-isolators 92 and 94 which causes the photo-transistors in the opto-isolators 92 and 94 to stop conducting. This isolates the high voltage battery 82 from the battery monitor 80, as well as all the associated battery line voltage and noise. It should be noted that in this embodiment, the battery 8;2 is not galvanically isolated from the battery monitor 80 as with the embodiment shown in FIG. 1 since the battery 82 is still electrically connected through the phototransistor side of the opto-isolator 92 and 94. However, the opto-isolators 92 and 94 can be replaced with electrical relays in which case the battery 82 would be galvanically isolated from the battery monitor 80. The microprocessor 96 then activates a second bank of opto-isolators 106 having a pair of opto-isolators 108 and 110. As with the bank of opto-isolators 90, the photodiodes in the opto-isolators 108 and 110 transmit an optical signal such that the phototransistors in the opto-isolators 108 and 110 are turned on so that the voltage across the capacitor 98 is applied to the positive and negative terminals of a differential amplifier 112.

The differential amplifier 112 determines the voltage difference between its positive and negative input terminals and applies this analog signal to an analog-to-digital (A/D) converter 114. The analog signal, representing the attenuated battery voltage, is digitized in the analog-to-digital converter 114 and applied to the microprocessor 96 through a buffer 116. The microprocessor 96 then sends the battery voltage to a module (not shown) requesting such information, via a communication bus 118. The microprocessor 96 includes address inputs 120 which determines a specific address for the battery monitor 80, via jumpers in the electric vehicle wire harness. It should be noted that the microprocessor 96 is the same as the microprocessor 52, shown in FIG. 1.

The temperatures of the batteries 82 in the battery tub 84 are monitored in substantially the same way as the temperature of the batteries 12 are monitored. Five (5) temperature monitors 122 monitor the temperature for every other battery 82 in the battery tub 84 since temperatures for adjacent batteries 82 are generally similar. The temperature monitor 22 consists of a 2.5 volt voltage reference (Vref) and a 20 kΩ resistor 124 connected in series with a filter capacitor 126. A 10 kΩ thermistor 128 is connected in parallel with the capacitor 126 and is positioned proximate to the battery 82 being monitored. Since the thermistor 128 is not electrically connected to the battery 82 but is merely mounted to the housing of the battery 82 there is no need to electrically isolate the signal supplied by the temperature module 122. However, this signal may also be isolated, as shown in FIG. 1.

The voltage drop across the five (5) thermistors 128 are applied to a multiplexer 130. The multiplexer 130 is a five channel analog multiplexer similar to the multiplexer 30, shown in FIG. 1. The channels of the multiplexer 130 are selected by the microprocessor 96, through a buffer 132. When a channel has been selected by the microprocessor 96, the voltage drop of that particular thermistor 128 is applied to the positive and negative terminals across the differential amplifier 112. Again, the voltage difference across the positive and negative terminals of the differential amplifier 112 is determined and applied to the analog-to-digital converter 114 to digitize the signal. This digital signal is subsequently applied to the microprocessor 96, through the buffer 116. The microprocessor 96 will do a linearization of the thermistor 128 temperature curve to determine the battery temperature based on the voltage drop across the thermistor 128. Again, this information will then be transmitted, via the communication bus 118.

The battery monitor 80 further includes a power supply 134 which is similar to the power supply 64 shown in FIG.

1. The power supply 134 includes primary windings 136 and secondary windings 138 which are isolated from one another since there is no feedback across the windings 136 and 138. This allows further isolation of the high battery voltages in the batteries 82 from the vehicle electronics.

In operation, a module on the electric vehicle will request a battery voltage and/or a battery temperature from the batteries 82 in the battery tub 84, via the communication bus 118. If a battery voltage is requested, the microprocessor 96 will first select which bank of opto-isolators 90 to activate depending on which battery 82 is to be monitored. The microprocessor 96 will then activate the photodicides in the opto-isolators 92 and 94, through buffers 140 and 142. This causes the phototransistors in the opto-isolators 92 and 94 to conduct thereby allowing the capacitor 98 to be charged through resistor 100. Once the capacitor 98 has been sufficiently charged, the microprocessor 96 turns off or opens the opto-isolators 92 and 94, via the buffers 140 and 142 and simultaneously activates the photodiodes in the opto-isolators 108 and 110, via buffers 144 and 146. This allows the charge on capacitor 98 be applied to the positive and negative terminals of the differential amplifier 112. The voltage difference between the positive and negative terminals is applied to the analog-to-digital converter 114 which converts the analog signal to a serial digital signal. This signal is then forwarded to the microprocessor 96, through the buffer 116.

If the battery temperature was requested, the microprocessor 96 will select a particular battery to be monitored by selecting the particular channel from the multiplexer 130. The voltage drop across the thermistor 128 attached to the selected battery 82 will be transferred through the multiplexer 130 and applied to the positive and negative terminals of the differential amplifier 112. This analog signal will then be digitized in the analog-to-digital converter 114 and applied to the microprocessor 96, via the buffer 116. The microprocessor 96 will do a linearization of the thermistor 128 temperature curve to determine the battery temperature based on the voltage drop across the thermistor 128. This temperature will then be transmitted, via the communication bus 118.

The foregoing discussions disclose and describe the preferred embodiments of the present invention. One skilled in the art would readily recognize from such a discussion, and from the accompanying drawings and claims, that various changes, modifications and variations can be made therein without departing from the spirit and scope of the invention as defined by the following claims.

What is claimed is:

1. A battery monitor for monitoring a plurality of batteries, said battery monitor comprising:
   means for providing a battery voltage signal indicative of the battery voltage of each of the plurality of batteries;
   a plurality of switches, said switches being independently selectively activated so as to provide the battery voltage signal of a particular battery of the plurality of batteries;
   controller means for selectively activating one of the switches to select a particular battery voltage signal; and
   a capacitor, said capacitor being responsive to the selected battery voltage signal from the selected one of a plurality of switches, said capacitor being charged by the selected battery voltage signal, said controller means deactivating the selected switch after the capacitor is charged by the selected battery voltage signal, said controller means being responsive to the voltage from the charged capacitor representative of the selected battery voltage signal after the selected switch is deactivated so as to determine the battery voltage of the selected battery.

2. The battery monitor according to claim 1 further comprising isolator means for separating the battery monitor into a high voltage side and a low voltage side, said plurality of batteries being on the high voltage side and said controller means being on the low voltage side, wherein the selected battery voltage signal is applied to the controller means through the isolator means.

3. The battery monitor according to claim 2 wherein the isolator means includes an opto-isolator and wherein the charge from the capacitor is sent to the controller means through the opto-isolator.

4. The battery monitor according to claim 1 further comprising switching means for allowing the controller means to determine the battery voltage of the selected battery voltage signal when current from the plurality of batteries is flowing in the battery monitor and when current from the plurality of batteries is interrupted.

5. The battery monitor according to claim 4 wherein the switching means includes at least on switched filter that is selectively switched into and out of the battery monitor by the controller means prior to the battery voltage signals being applied to the plurality of switches, said at least one switched filter allowing the controller means to provide an instantaneous battery voltage measurement when the switched filter is switched filter is switched out of the battery monitor, and a filtered battery voltage measurement when the switched filter is switched filter is switched into the battery monitor.

6. The battery monitor according to claim 1 wherein the plurality of switches is a plurality of opto-isolators where each isolator is connected to one of either a positive terminal or negative terminal of one of the plurality of batteries.

7. The battery monitor according to claim 1 wherein the plurality of switches is a plurality of electrical relays where each relay is connected to one of either a positive terminal or negative terminal of one of the plurality of batteries.

8. The battery monitor according to claim 1 further comprising temperature measurement means for determining the temperature of at least some of the plurality of batteries, said temperature measurement means transmitting battery temperature signals to the controller means.

9. The battery monitor according to claim 1 wherein the battery monitor monitors the batteries associated with an electric vehicle, said battery monitor being positioned proximate to a battery tub that holds a plurality of batteries in the vehicle.

10. A battery monitor for monitoring a plurality of batteries of an electric vehicle, said plurality of batteries being positioned within a battery tub in the vehicle, said battery monitor comprising:
    means for providing a battery voltage signal indicative of the battery voltage of each of the plurality of batteries;
    temperature measuring means for measuring the temperature of at least some of the plurality of batteries, said temperature measuring means generating a battery temperature signal;
    a plurality of switches, said plurality of switches being independently selectively activated so as to provide the battery voltage signal of a particular battery of the plurality of batteries;
    controller means for selectively activating one of the plurality of the switches to select a particular battery voltage signal, said controller means being responsive to the selected battery voltage signal and the temperature signal;

a capacitor, said capacitor being responsive to the selected battery voltage signal from the selected one of the plurality of switches, said capacitor being charged by the selected battery voltage signal, said controller means deactivating the selected switch after the capacitor is charged by the selected battery voltage signal, said controller means being responsive to the voltage from the charged capacitor representative of the selected battery voltage signal after the selected switch is deactivated so as to determine the battery voltage of the selected battery; and isolator means for separating the battery monitor into a high voltage side and a low voltage side, said plurality of batteries being on the high voltage side and said controller means being on the low voltage side, wherein the selected battery voltage signal is applied to the controller means through the isolator means.

11. The battery monitor according to claim 10 wherein the isolator means includes an opto-isolator, and wherein the charge from the capacitor is sent to the controller means through the opto-isolator.

12. The battery monitor according to claim 10 further comprising switching means for allowing the controller means to determine the battery voltage of the selected battery voltage signal when current from the plurality of batteries is flowing in the battery monitor and when current from the plurality of batteries is interrupted.

13. The battery monitor according to claim 12 wherein the switching means includes at least one switched filter that is selectively switched into and out of the battery monitor by the controller means through the isolator means prior to the battery voltage signals being applied to the plurality of switches, said at least one switched filter allowing the controller means to provide an instantaneous battery voltage measurement when the switched filter is switched out of the battery monitor, and a filtered battery voltage measurement when the switched filter is switched into the battery monitor.

14. A battery monitor for monitoring a plurality of batteries, said battery monitor comprising:

a plurality of electrical lines connected to the plurality of batteries and providing a battery voltage signal indicative of the battery voltage for each of the plurality of batteries;

a plurality of switches, said switches being independently selectively activated so as to provide the battery voltage signal of a particular battery of the plurality of batteries;

a controller, said controller selectively activating one of the plurality of switches to select a particular battery voltage signal; and a capacitor, said capacitor being responsive to the selected battery voltage signal from the selected one of the plurality of switches, said capacitor being charged by the selected battery voltage signal, said controller deactivating the selected switch after the capacitor is charged by the selected battery voltage signal, and said controller being responsive to the voltage on the charged capacitor representative of the selected battery voltage signal after the selected switch is deactivated so as to determine the battery voltage of the selected battery.

15. The battery monitor according to claim 14 further comprising an isolator, said isolator separating the battery monitor into a high voltage side and a low voltage side, said plurality of batteries being on the high voltage side and said controller being on the low voltage side, wherein the selected battery voltage signal is applied to the controller through the isolator.

16. The battery monitor according to claim 14 further comprising a temperature measurement device, said temperature measurement device determining the temperature of at least one of the plurality of batteries, said temperature measurement device transmitting battery temperature signals to the controller.

17. A battery monitor for monitoring a plurality of batteries, said battery monitor comprising:

means for providing a battery voltage signal indicative of the battery voltage of each of the plurality of batteries;

a plurality of switches, said switches being independently selectively activated so as to provide the battery voltage signal of a particular battery of the plurality of batteries;

controller means for selectively activating one of the switches to select a particular battery voltage signal;

temperature measurement means for determining the temperature of at least one of the plurality of batteries, said temperature measurement means transmitting battery temperature signals to the controller means; and a capacitor, said capacitor being responsive to the selected battery voltage signal from the selected one of a plurality of switches, said capacitor being charged by the selected battery voltage signal, said controller means deactivating the selected switch after the capacitor is charged by the selected battery voltage signal, said controller means being responsive to the voltage from the charged capacitor representative of the selected battery voltage signal after the selected switch is deactivated so as to determine the battery voltage of the selected battery.

18. A battery monitor for monitoring a plurality of batteries, said battery monitor comprising:

a plurality of electrical lines connected to the plurality of batteries and providing a battery voltage signal indicative of the battery voltage for each of the plurality of batteries;

a plurality of switches, said switches being independently selectively activated so as to provide the battery voltage signal of a particular battery of the plurality of batteries;

a controller, said controller selectively activating one of the plurality of switches to select a particular battery voltage signal; and a capacitor, said capacitor being responsive to the selected battery voltage signal from the selected one of the plurality of switches, said capacitor being charged by the selected battery voltage signal, said controller deactivating the selected switch after the capacitor is charged by the selected battery voltage signal, and said controller being responsive to the voltage on the charged capacitor representative of the selected battery voltage signal after the selected switch is deactivated so as to determine the battery voltage of the selected battery, wherein the battery monitor monitors the batteries associated with an electric vehicle, said battery monitor being positioned within a battery tub that holds a plurality of batteries in the vehicle.

19. A battery monitor for monitoring a plurality of batteries, said battery monitor comprising:

a plurality of electrical lines connected to the plurality of batteries and providing a battery voltage signal indicative of the battery voltage for each of the plurality of batteries;

a plurality of opto-isolator switches, where a separate opto-isolator switch is connected to one of either a positive terminal or a negative terminal of one of the plurality of batteries, said opto-isolator switches being independently selectively activated so as to provide the battery voltage signal of a particular battery of the plurality of batteries;

a controller, said controller selectively activating one of the plurality of switches to select a particular battery voltage signal; and a capacitor, said capacitor being responsive to the selected battery voltage signal from the selected one of the plurality of opto-isolator switches, said capacitor being charged by the selected battery voltage signal, said controller deactivating the selected switch after the capacitor is charged by the selected battery voltage signal, and said controller being responsive to the voltage on the charged capacitor representative of the selected battery voltage signal after the selected switch is deactivated so as to determine the battery voltage of the selected battery.

20. A battery monitor for monitoring a plurality of batteries, said battery monitor comprising:

a plurality of electrical lines connected to the plurality of batteries and providing a battery voltage signal indicative of the battery voltage for each of the plurality of batteries;

a plurality of switches, said switches being independently selectively activated so as to provide the battery voltage signal of a particular battery of the plurality of batteries;

a controller, said controller selectively activating one of the plurality of switches to select a particular battery voltage signal;

an isolator, said isolator separating the battery monitor into a high voltage side and a low voltage side, said plurality of batteries being on the high voltage side and said controller being on the low voltage side, wherein the selected battery voltage signal is applied to the controller through the isolator; and a capacitor, said capacitor being responsive to the selected battery voltage signal from the selected one of the plurality of switches, said capacitor being charged by the selected battery voltage signal, said controller deactivating the selected switch after the capacitor is charged by the selected battery voltage signal, and said controller being responsive to the voltage on the charged capacitor representative of the selected battery voltage signal after the selected switch is deactivated so as to determine the battery voltage of the selected battery.

* * * * *